United States Patent [19]

Nakagawa

[11] Patent Number: 4,980,516
[45] Date of Patent: Dec. 25, 1990

[54] ELECTROMAGNETIC-SHIELDING GASKET

[75] Inventor: Asaharu Nakagawa, Yokkaichi, Japan

[73] Assignee: Kitagawa Industries Co., Ltd., Aichi, Japan

[21] Appl. No.: 426,201

[22] Filed: Oct. 25, 1989

[30] Foreign Application Priority Data

Oct. 26, 1988 [JP] Japan .................................. 63-270154
Aug. 19, 1989 [JP] Japan .................................. 1-213791

[51] Int. Cl.$^5$ ............................................. H05K 9/00
[52] U.S. Cl. ......................... 174/35 GC; 174/35 MS; 277/228; 277/901
[58] Field of Search .................. 277/228, 237 R, 901; 174/35 GC, 35 MS, 50, 59; 428/299, 368, 408

[56] References Cited

U.S. PATENT DOCUMENTS

| | | | |
|---|---|---|---|
| 2,885,459 | 5/1959 | Pulsifer et al. | 174/35 GC |
| 3,126,440 | 3/1964 | Goodloe | 174/35 GC |
| 3,542,939 | 11/1970 | Mintz | 277/235 R X |
| 4,096,459 | 6/1978 | Lowenhar | 174/69 X |
| 4,288,081 | 9/1981 | Sado | 277/901 X |
| 4,577,872 | 3/1986 | Bake et al. | 277/901 X |
| 4,725,693 | 2/1988 | Hirsch | 174/106 SC X |
| 4,769,514 | 9/1988 | Uematsu et al. | 174/102 A |

FOREIGN PATENT DOCUMENTS

| | | |
|---|---|---|
| 0113277 | 12/1983 | European Pat. Off. |
| 2101621 | 3/1982 | United Kingdom |
| 2129070 | 10/1983 | United Kingdom |

Primary Examiner—Allan N. Shoap
Assistant Examiner—Scott Cummings
Attorney, Agent, or Firm—Oliff & Berridge

[57] ABSTRACT

An electromagnetic-shielding gasket of this invention is composed of an elastic body. The elastic body contains a filler of whisker-shaped carbon fiber with a micro diameter. The carbon fiber is developed from ultrafine particles of a high-melting metal and/or the compound of the high-melting metal through a vapor-phase system. The carbon fiber developed in the vapor phase is uniformly dispersed in the elastic body. Consequently, the electromagnetic-shielding gasket has a uniform low electric resistivity and an elasticity. By fitting the electromagnetic-shielding gasket onto gaps in the housing of electronic components, the housing is kept watertight and airtight, and electromagnetic waves are prevented from passing through the gaps.

5 Claims, 1 Drawing Sheet

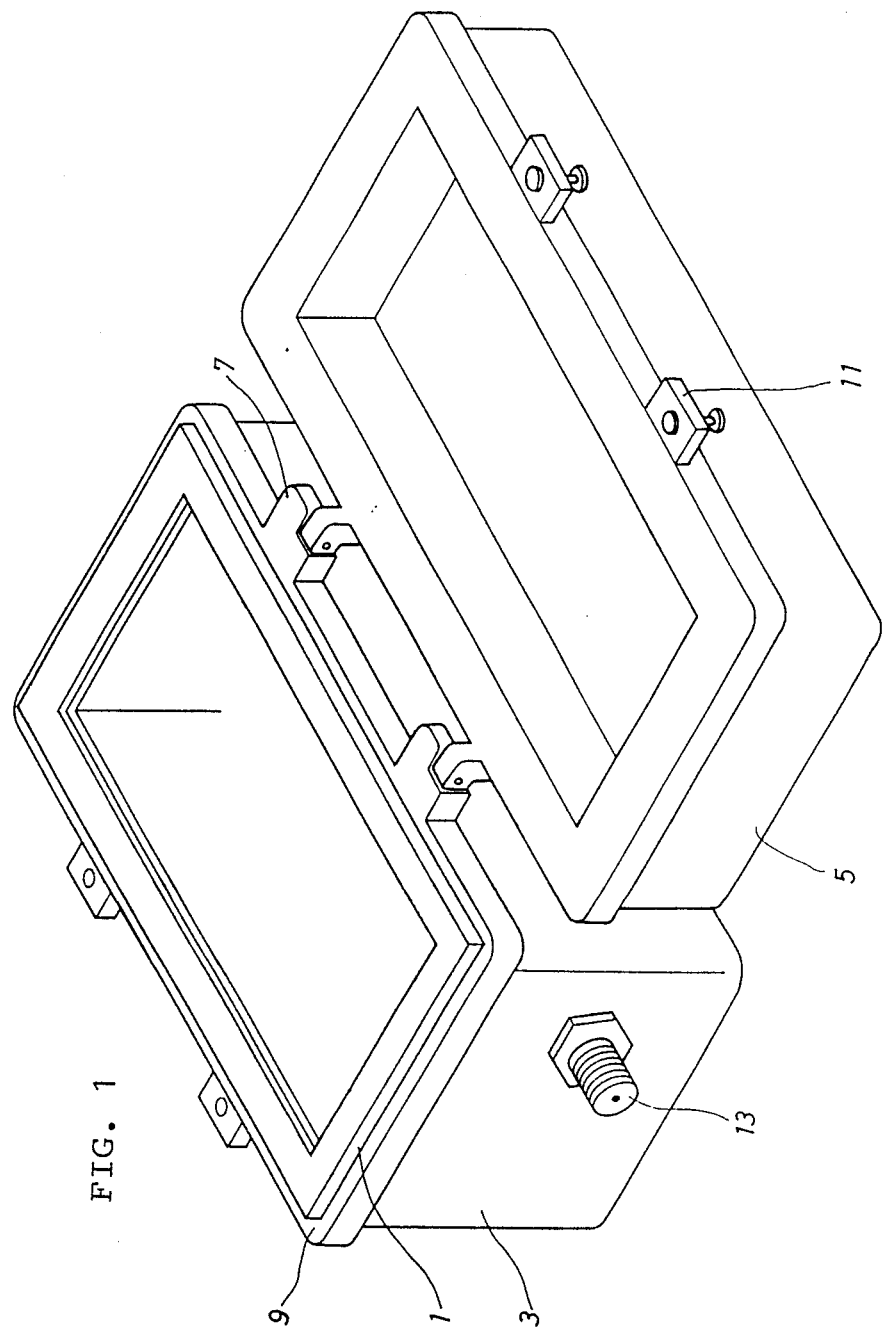

ELECTROMAGNETIC-SHIELDING GASKET

BACKGROUND OF THE INVENTION

This invention relates to an electromagnetic-shielding gasket placed around a joint between conductive housings of electronic components or between the conductive housing and a cover member.

These days, office equipment such as electronic typewriters and printers, household appliances such as washing machines and vacuum cleaners, and the like increasingly use electronic components like microcomputers. Even automobiles equipped with electronic control systems for fuel injection are increasing rapidly. Thus, the number of microcomputers is increasing. Moreover, the clock frequency of microcomputers is also increasing. Electronic components are generating increasing amounts of electromagnetic noise. This noise leaks through gaps in the housing of electronic components, and may be transmitted through signal conductors to other electronic components, thus causing malfunctions or damaging the other electronic components.

In the related art, gaps in the housing of the components are filled with an electromagnetic-shielding gasket consisting of conductive metal (referred to as "the metallic gasket"), an electromagnetic-shielding gasket consisting of elastomer containing conductive-metallic particles or carbon black (referred to as "the elastomer gasket"), or an electromagnetic-shielding gasket consisting of elastomer coated with meshed metal (referred to as "the meshed gasket") to prevent electromagnetic waves from entering the electronic components.

By filling the gap in the housing with the metallic gasket, the elastomer gasket, or the meshed gasket, the housing conducts electricity to the cover or another housing. Electromagnetic noise generated by the electronic components in the housing or entering from outside into the housing is reflected and absorbed by the conductive housing and the gasket. The electronic components in the housing are thus protected from electromagnetic waves.

However, neither the metallic gasket, the elastomer gasket nor the meshed gasket sufficiently shields the electronic components from electromagnetic waves, and each has problems.

Often the housing the electronic components must be airtight or watertight depending on the environment in which the electronic components operate. For example, the place where a washing machine is operated is very humid. With automobiles, various environments are possible. Thus airtightness and watertightness are required for electronic-component housings for washing machines and automobiles. The electromagnetic-shielding gasket must have conductivity or low electric resistivity to shield the electronic components from electromagnetic noise. The electromagnetic-shielding gasket must also be elastic so as to fit any gap in the housing and make the housing airtight or watertight. However, the related-art metallic gasket cannot resiliently deform or completely seal the housing. When the related-art meshed gasket is compressed, the meshed metal permanently strains, thereby deteriorating the elasticity of the elastomer.

On the other hand, the related-art elastomer gasket has high conductivity because the gasket contains conductive metallic particles or carbon black (referred to as "conductive particles"). The gasket also has elasticity because its base material is elastomer. When the content of the conductive particles is increased, the electric resistivity is reduced. However, when the content of the conductive particles exceeds a fixed amount, the elasticity of the elastomer deteriorates. Consequently, the content of the conductive particles has an upper limit, so that the elasticity of the elastomer can be maintained. However, even at that upper limit, the electric resistivity of the elastomer gasket exceeds 10 ohm.cm, and the elastomer gasket provides an insufficient electromagnetic-shielding effect.

SUMMARY OF THE INVENTION

The object of this invention is to provide an electromagnetic-shielding gasket that has elasticity and conductivity (low electric resistivity) for fitting an electronic-component housing and making the housing airtight and watertight.

This object is attained by a conductive seal for filling a gap between first and second surfaces comprising: a body of elastic material for filling the gap between the first and second surfaces; and interlaced carbon fibers distributed in the body such that the body is electrically conductive.

The electromagnetic-shielding gasket of this invention thus contains a specified carbon fiber as a conductive filler. The carbon fiber, different from polyacrylonitrile or pitch carbon fiber, is whisker shaped with a diameter much smaller than that of the conductive particles. In this invention, the carbon fiber is dispersed and retained in the elastic body of the base material. The carbon fibers dispersed in the base material become interlaced, entangling with and contacting each other. Electrical current can flow through the interlaced carbon fibers, thereby providing a uniform conductivity to the elastic body. The electromagnetic-shielding gasket thus provided with conductivity fits the gap in the conductive housing, and gives conductivity further to the conductive housing. Consequently, the inside and the outside of the conductive housing are shielded from electromagnetic waves.

The amount of the carbon fiber contained in the elastic body of the electromagnetic-shielding gasket determines the conductivity or the electric resistivity of the electromagnetic-shielding gasket. The carbon fiber content in the elastic body can thus be adjusted according to the electromagnetic noise inside and outside the conductive housing of the electronic components.

When compressed, the carbon fiber in the elastic body longitudinally deflects. The elastic body of the electromagnetic-shielding gasket thus maintains elasticity under stress.

The carbon fiber content should be between 15% and 60% by weight, preferably between 25 and 50% by weight, so that the electromagnetic-shielding gasket comprising the elastic body has conductivity suitable for an electromagnetic-shielding material, but sufficient elasticity for making the housing containing electronic components watertight and airtight. When the content of the carbon fiber is specified in this range, the electric resistivity of the electromagnetic-shielding gasket is lower than 10 to 15 ohm·cm. Further, the physical properties of the electromagnetic-shielding gasket are prevented from deteriorating.

The high-melting metal for developing the carbon fiber does not gasify at 950°]C. to 1300° C., the temperature range in which hydrocarbon is thermally decomposed. For the high-melting metal, available is titanium (Ti), zirconium (Zr) or the like in group IVa according to the periodic system, vanadium (V), niobium (Nb) or tantalum (Ta) in group Va, chromium (Cr), molybdenum (Mo) or the like in group VIa, manganese (Mn) or the like in group VIIa, or iron (Fe), cobalt (Co), nickel (Ni) or the like in group VIII. Metals Fe, Co, Ni, V, Nb, Ta, Ti, and Zr are best. The oxide, nitride, chloride or the like of the metals is used as the high-melting metal compound.

The elastic body basing the electromagnetic-shielding gasket should be composed of the material that can contain the carbon fiber and have elasticity. For example, a suitable material is elastomer such as chloroprene rubber, silicone rubber, polyurethane rubber, crude rubber or the like, a soft foam synthetic resin containing bubbles resulting from a foaming agent or from mixing during the process of polymerization, or the like. The elastomer or the soft foam synthetic resin can be selected according to the conditions such as the required resistance to heat or oil.

BRIEF DESCRIPTION OF THE DRAWINGS

FIG. 1 is a perspective view of a first embodiment showing one application of the present invention.

DETAILED DESCRIPTION OF THE PREFERRED EMBODIMENTS

An electromagnetic-shielding gasket is applied to the rim of a housing that is fitted with a movable lid. Embodiments of the electromagnetic-shielding gasket are explained with reference to the drawing.

In FIG. 1, an electromagnetic-shielding gasket 1 of the first embodiment is attached to a housing 3 that houses electronic components.

The base material of the electromagnetic-shielding gasket 1 is polyurethane rubber (polyurethane elastomer) manufactured through known processes. The carbon fiber of 25% by weight is dispersed in the polyurethane rubber. The attached electromagnetic-shielding gasket 1 frames an opening in the housing 3.

The carbon fiber is developed from iron particles with a particle diameter of 0.02 microns to 0.03 microns through a vapor-phase system by decomposing benzene in a reactor at 950° C. to 1300° C. The developed carbon fiber (referred to as "the carbon fiber developed in the vapor phase) has a diameter of 0.1 microns to 0.5 microns and a length of 0.1 mm to 1 mm, and has the following physical properties: a tensile strength of 200 kg/mm$^2$, an elasticity of 20t/mm$^2$, and a volume resistivity of 0.001 ohm.cm.

The carbon fiber developed in the vapor phase has a specific gravity of 1.87 and a high adhesion to synthetic rubbers including polyurethane rubber. The electromagnetic-shielding gasket 1 is a polyurethane-rubber gasket in which the carbon fiber developed in the vapor phase is uniformly dispersed. The volume resistivity of the electromagnetic-shielding gasket 1 is uniformly as low as 3.5 ohm·cm. The leakage of electromagnetic waves into or from the housing 3 can be uniformly reduced.

The carbon fiber developed in the vapor phase is mixed into the polyurethane rubber by a known process, such as mixing or polymerization, before the polyurethane rubber is formed into a gasket. During the mixing process, the carbon fibers entangle and come into contact with each other. Accordingly, when the gasket is formed, the carbon fibers are interlaced, forming conductive paths through the gasket.

The electromagnetic-shielding gasket 1 of the first embodiment is attached to the housing 3. The housing 3, which is a metallic rectangular parallelepiped, has an opening for housing electronic components. A metallic lid 5 swings on hinges 7 to cover the opening. The electromagnetic-shielding gasket 1 is attached using a conductive adhesive on a rim 9 that abuts the lid 5 when the lid 5 is closed. The housing 3 and the lid 5 have locks 11 to close the housing 3 with the electromagnetic-shielding gasket 1 tightly against the lid 5, thus sealing the electronic components in the housing 3. A signal conductor (not shown) for the electronic components in the housing 3 passes through a waterproof connector 13 in the side surface of the housing 3.

In operation, after the electronic components are housed in the housing 3, the lid 5 is closed tightly with the locks 11 and the electromagnetic shielding gasket 1 completely fills the gap between the housing 3 and the lid 5.

By using the electromagnetic-shielding gasket 1, the following effects are expected.

The volume resistivity of the electromagnetic-shielding gasket 1 is uniformly as low as 3.5 ohm cm. The electromagnetic-shielding gasket 1 conducts electricity to the housing 3 and the lid 5, and securely seals out from electromagnetic waves. The electronic components in the housing 3 are shielded from electromagnetic waves outside and are prevented from causing malfunctions due to electromagnetic noise.

The carbon fiber developed in the vapor phase, which is dispersed in the polyurethane rubber of the electromagnetic-shielding gasket 1, has a small diameter of 0.1 microns to 0.5 microns and a high adhesion to synthetic rubber. In addition, the carbon fiber deflects when the polyurethane rubber under compression is resiliently deformed. The electromagnetic-shielding gasket 1 thus maintains the elasticity close to that of the polyurethane rubber. When the lid 5 is tightly closed, the electromagnetic-shielding gasket 1 is compressed to fit the housing 3 and the lid 5, thus protecting the electronic components sealed in the housing 3 from humidity and air outside.

In addition, since the electromagnetic-shielding gasket 1 contacts the surfaces of both the housing 3 and the lid 5, the contact resistance is reduced. Since the electromagnetic-shielding gasket 1 has a rectangular section and such a simple configuration, the cost for manufacturing its metallic mold can be reduced.

The electromagnetic-shielding gasket for a second embodiment has the same configuration as that of the first embodiment, and it is applied to the housing in the same way as the first embodiment shown in FIG. 1. Only the different characteristics of the second embodiment from the first embodiment are explained below.

The electromagnetic-shielding gasket of the second embodiment uses silicone rubber with a foaming agent added (soft foam body). The carbon fiber developed in the vapor phase as aforementioned is mixed by 30% by weight in the silicone rubber prior to foaming.

The silicone rubber containing the carbon fiber developed in the vapor phase and the foaming agent is extruded by a known extruder, heated at from 250° C. to 260° C. to foam and formed into a rectangular parallelepiped with a 5 mm by 10 mm cross-section.

The electromagnetic-shielding gaskets A and B manufactured by the above method are compared with a meshed gasket M·G. This meshed gasket is a elastic rectangular parallelepiped body with a 5 mm by 10 mm cross section composed of silicone rubber and is coated with a meshed metal with a electric resistivity of $2.5 \times 10^{-6}$ ohm. The results of the comparison are shown in Table 1.

TABLE 1

|  | SECOND EMBODIMENT | | FOR COMPARISON |
| --- | --- | --- | --- |
| TEST PIECE | A | B | M · G |
| EXPANSION RATIO *1 | 3.0 | 4.5 | — |
| VOLUME RESISTIVITY *2 | 4.8 | 15.3 | —*5 |
| COMPRESSIVE FORCE *3 | 0.38 | 0.43 | 0.75 |
| COMPRESSION PERMANENT SET*4 | 6.9 | 8.3 | 18.8 |

NOTES:
*1 - Independent foam, Units: time
*2 - Units: ohm · cm
*3 - The relationship between stress and strain is examined by using a tension tester, and the force required for 35% compression is calculated. Units: kg/cm²
*4 - After the test explained in above *3 is repeated three times, this compression permanent set is observed on the test pieces. Units: %
*5 - Since silicone rubber is an insulating material, the volume resistivity of the gasket cannot be measured.

The meshed gasket M.G is clad with a meshed wire, but, as shown in Table 1, it receives a large compression permanent set and fails to recover its original size and shape quickly. When the meshed gasket M G is repeatedly used, its airtightness and watertightness may be deteriorated. In addition, the meshed wire may be worn or cut, thereby changing the electric resistivity of the surface of the meshed gasket M.G. The electromagnetic-shielding effect of the meshed gasket M.G is thus deteriorated.

On the other hand, the electromagnetic-shielding gaskets A and B have a low volume resistivity and maintain their elasticity. As explained in the first embodiment, when the electromagnetic-shielding gasket A or B is attached to the housing to abut the lid, it conducts electricity between the housing and the lid when the lid closes the opening in the housing. The electronic components in the housing are securely protected from electromagnetic waves outside. When the gaskets A and B are repeatedly used, the carbon fiber developed in the vapor phase keeps dispersed in the foam silicone rubber without change. Consequently, the gaskets A and B maintain the electromagnetic-shielding effect. Since the electromagnetic shielding gaskets A and B under stress recover their original size and shape after the removal of the stress, the housing the electronic components through the gaskets A and B can be airtight or watertight.

The electromagnetic-shielding gaskets A and B, whose base material is silicone rubber, are resistant to heat, oil, and ozone cracks, and can be used in various environments.

Although specific embodiments of the invention have been shown and described for the purpose of illustration, the invention is not limited to the embodiments illustrated and described. This invention includes all embodiments and modifications that come within the scope of the claims.

For example, the configuration of the cross section of the electromagnetic-shielding gasket is not limited to a polygon like a quadrangle. The electromagnetic-shielding gasket for the embodiments can have a circular, ring-shaped, Y-shaped, L-shaped, anchor-shaped or other modified cross section.

The expansion ratio illustrated in the second embodiment can be altered according to the application conditions. The expansion ratio can be various in the same soft foam body. For example, when the surface of the soft foam body has a small expansion ratio, it smoothens. In addition, the carbon fibers developed in the vapor phase are densely dispersed on the surface of the soft foam body, thus decreasing the electric resistivity of the surface of the soft foam body. The contact resistance of the electromagnetic-shielding gasket is reduced accordingly. Therefore, the electromagnetic-shielding gasket conducts electricity between the housing and the lid, and provides a electromagnetic-shielding effect.

In addition, the content of the carbon fiber developed in the vapor phase is not limited to the values explained in the first and second embodiments. This content can be selected from the range between 15% and 60% by weight, preferably between 25% and 50% by weight. The amount of the carbon fiber contained in polyurethane rubber body has the relationship with the physical properties of the electromagnetic-shielding gasket obtained as shown in Table 2.

TABLE 2

| CONTENT OF THE CARBON FIBER (% BY WEIGHT) | 10 | 20 | 30 | 50 | 60 | 70 |
| --- | --- | --- | --- | --- | --- | --- |
| VOLUME RESISTIVITY (ohm · cm) | 20 | 8 | 0.9 | 0.1 | 0.05 | 0.01 |
| SHIELDING EFFECT (dB)*1 | 5 | 18 | 33 | 41 | 49 | 55 |
| HARDNESS*2 | 41 | 46 | 53 | 61 | 73 | 85 |
| TEARING STRENGTH (kgf/cm)*3 | 13.2 | 14.5 | 15.6 | 17.8 | 18.9 | 18.8 |
| COMPRESSION PERMANENT SET (%)*4 | 8 | 8 | 12 | 20 | 24 | 35 |

NOTES:
*1 - 200MHz is applied. Specimen size: 150 mm × 150 mm × 1.5 mm
*2 - according to the testing method specified in JIS-K6301 JIS-A type measuring apparatus is used.
*3 - according to the testing method specified in JIS-K6301 Specimen configuration: A type dumbbell specimen
*4 - according to the testing method specified in JIS-K6301 Testing condition: 180° C. × 22 hours

What is claimed is:

1. A conductive seal for filling a gap between first and second surfaces, comprising:
   a body of elastic material composed of an elastomer chosen from the group consisting of chloroprene rubber, silicone rubber, polyurethane rubber, crude rubber, and soft foam synthetic resin;
   said body of elastic material having interlaced carbon fibers distributed in the body such that the body is electrically conductive;

said carbon fibers having an elasticity of substantially 20 t/mm² and a volume resistivity of substantially 0.001 ohmcentimeters; and wherein said carbon fibers are developed through a vapor-phase cracking process by using particles of a high-melting point metal or compounds thereof which have a diameter of 0.02–0.03 microns.

2. The conductive seal of claim 1, wherein the content of carbon fiber in the elastic body is between 15% and 60% by weight.

3. The conductive seal of claim 1, wherein the carbon fibers have a diameter between 0.1 microns to 0.5 microns and a length between 0.1 millimeter and 1.0 millimeters.

4. The conductive seal of claim 1, wherein the carbon fibers distributed in the body longitudinally deflect when the body is compressed.

5. The conductive seal of claim 1, wherein the first surface is a conductive surface on a housing means for housing electrical components, the second surface is a conductive surface on a covering means for covering an opening in the housing means, and the elastic body is formed into a gasket that forms an airtight, watertight seal around the opening and prevents electromagnetic noise from passing through the opening.

* * * * *